United States Patent [19]

Häusele

[11] Patent Number: 4,564,924

[45] Date of Patent: Jan. 14, 1986

[54] MEMORY MODULE WITH EXTRA SPACING BETWEEN REDUNDANT ROWS AND COLUMNS

[75] Inventor: Hans Häusele, Munich, Fed. Rep. of Germany

[73] Assignee: Siemens Aktiengesellschaft, Berlin and Munich, Fed. Rep. of Germany

[21] Appl. No.: 500,333

[22] Filed: Jun. 2, 1983

[30] Foreign Application Priority Data

Jun. 4, 1982 [DE] Fed. Rep. of Germany ....... 3221268

[51] Int. Cl.$^4$ .................. G11C 29/00; G11C 5/02
[52] U.S. Cl. .................................... 365/200; 365/51
[58] Field of Search ................... 365/200, 201, 51; 371/21, 10, 8; 357/45

[56] References Cited

U.S. PATENT DOCUMENTS 4,471,472  9/1984  Young ........................... 365/200

Primary Examiner—Stuart N. Hecker
Assistant Examiner—Glenn A. Gossage
Attorney, Agent, or Firm—Herbert L. Lerner; Laurence A. Greenberg

[57] ABSTRACT

An integrated memory module, includes at least one normally addressable cell array with edges and a matrix of memory cells disposed in rows and/or columns, the rows and/or columns being mutually spaced apart by a given distance, and redundant or spare memory cells disposed in rows and/or columns at the edges of the cell array for connection instead of defective rows and/or columns of memory cells in the cell array, the rows and/or columns of redundant memory cells being spaced apart from each other and from the rows and/or columns of memory cells of the cell array by distances being greater than the given distance.

10 Claims, 2 Drawing Figures

MEMORY MODULE WITH EXTRA SPACING BETWEEN REDUNDANT ROWS AND COLUMNS

The invention relates to an integrated memory module with at least one normally addressable cell array of memory cells disposed in matrix fashion and spare or redundant memory cells disposed in rows and/or columns at the edges of the cell array, which can be connected instead of defective rows or columns in the cell array.

In testing a memory formed of a multiplicity of integrated memory modules, it is very difficult, and it is only possible with a large expenditure in labor and time, to identify a defective memory module, so that it is advisable to use only pre-tested memory modules. However, the testing of highly integrated memory modules with special testing programs, and especially the investigation of interference on adjacent memory cells, also takes a great deal of time. The testing of a module with n memory cells requires $2n^2$ testing steps if the topographic disposition of the memory cells is not known (as discussed in Microelectronics Journal Vol. 10, No. 1, 1979, pages 27 to 34). In highly integrated memory modules, this leads to testing costs which amount to 30% and more of the total manufacturing costs. The users of such devices have therefore been given data regarding topography. The data gives the sequence in which external addresses are to be applied to the address inputs so as to continuously cover all rows and columns in the memory cell array. If the topography is completely known, the number of testing steps is reduced to 2n, because then there is no longer a need to test each memory cell against every other, or expressed more accurately, each address against every other.

In spite of the noteworthy advances in manufacturing techniques, the share of defective memory modules in the total output is increasing rather than decreasing because of the continuously increasing integration density and the reduction of the linear dimensions connected therewith. Therefore, more and more frequently redundant memory rows and/or columns are provided, in which defective rows and/or columns of the memory cell array are replaced by means of special reprogramming elements during the wafer tests. Since a basically defective and therefore unsalable chip can be made into a fully operable one in this manner, considerable increases in yield (up to a factor of 10) can be obtained.

It is conventional to place redundant rows and columns at the edges of the normal cell array (as discussed in Redundancy... Solution for the 80's, Intel Corporation, USA, 1980).

However, as a result of the replacement connection, the originally available knowledge of the adjacency relationship of the memory cells is lost, because the replacement circuit is different for each module. Thus, nonlinear test programs with their great time demands are again necessary for testing such modules. As a way out of this difficulty, a possibility might be to provide each memory module with a replacement circuit record. This, however, would not be practically feasible for several reasons.

It is accordingly an object of the invention to provide a memory module with redundant memory elements, which overcomes the hereinafore-mentioned disadvantages of the heretofore-known devices of this general type, and to do so in such a manner that a complete test with testing times depending linearly on the number of memory cells is possible, even without knowledge of the replaced rows and/or columns.

With the foregoing and other objects in view there is provided, in accordance with the invention, an integrated memory module, comprising at least one normally addressable cell array with edges and a matrix of memory cells disposed in rows and/or columns, the rows and/or columns being mutually spaced apart by a given distance, and redundant or spare memory cells disposed in rows and/or columns at the edges of the cell array for connection instead of defective rows and/or columns of memory cells in the cell array, the rows and/or columns of redundant memory cells being spaced apart from each other and from the rows or columns of memory cells of the cell array by distances being distinctly greater than the given distance.

In accordance with another feature of the invention, there is provided an integrated memory module, comprising at least one normally addressable cell array with edges and a matrix of memory cells disposed in rows and/or columns, and redundant or spare memory cells disposed in rows and/or columns at the edges of the cell array for connection instead of defective rows and/or columns of memory cells in the cell array, the rows and/or columns of redundant memory cells including at most one row and/or column disposed outside the cell array and at least one row and/or column disposed in the interior of the cell array, at least one row and/or column of memory cells of the cell array being disposed between each two adjacent rows and/or columns of redundant memory cells.

In accordance with a concomitant feature of the invention, the rows or columns of memory cells of the cell array include rows or columns adjacent the rows or columns of redundant memory cells and other rows or columns, and the rows or columns of redundant memory cells are spaced apart from the adjacent rows or columns of memory cells of the cell array by a distance being greater than the distance between the other rows or columns of memory cells of the cell array.

Other features which are considered as characteristic for the invention are set forth in the appended claims.

Although the invention is illustrated and described herein as embodied in a memory module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
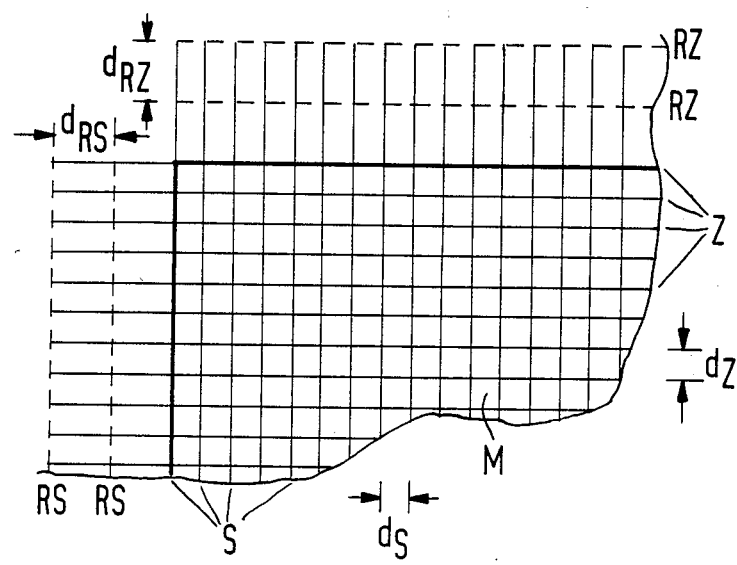
FIG. 1 is a fragmentary, diagrammatic view of cells of a memory module.

Referring now to the figures of the drawing in detail, and first particularly to FIG. 1 thereof, there is seen a section of a cell array M, the rows Z and columns S of which are indicated by intersecting straight lines. The border row and the border column of this array M of cells are delineated by heavier lines. The rows Z and the columns S of the cell array M are mutually spaced apart by the distances $d_Z$ and $d_S$, respectively. Outside this cell array M, two spare rows RZ and two spare columns RS are provided, as indicated by broken lines. The respective spacings $d_{RZ}$ and $d_{RS}$ between the redundant spare rows and columns and between the spare rows and columns and the outer row or column of the cell array M are distinctly larger, and preferably about twice as large, as the corresponding spacings $d_Z$ and $D_S$ between the rows Z and the columns S within the cell array M. This greatly reduces the probability of the occurence of adjacency interference between memory cells of adjacent spare rows and the outer row of the cell array as well as between memory cells of adjacent spare columns and the outer column of the cell array, so that even in a replacement circuit having unknown addresses, a separate check (which would lead to non-linear test programs) of the adjacency relationships, as a rule is unnecessary. Possible interferences due to the small spacings of the memory cells within the spare rows or spare columns are detected in any event by linear test programs. The increase in area, which is required due to the greater row and/or column spacings, does not weigh heavily in highly integrated memory modules which may have 256 rows and 1024 columns, for example, within the cell array M, since it is still only necessary to provide comparatively few spare rows and spare columns.

Figure 2:
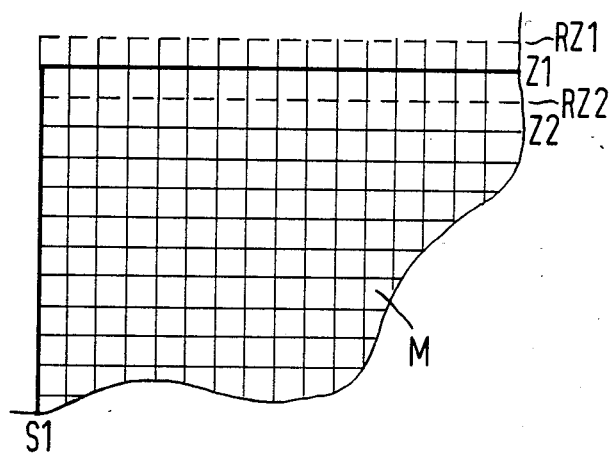
FIG. 2 is a view similar to FIG. 1 of another embodiment of the device.

Another embodiment for the disposition of redundant rows and columns relative to the cell array M with the objective of obtaining short testing times is seen from FIG. 2. In this structure, only one respective spare row and one respective spare column are provided outside the cell array M, although a maximum total of two spare rows and two spare columns are provided at its edges. In the case assumed for FIG. 2, wherein more than the above-mentioned spare elements are to be made available, this is accomplished by placing the further spare rows and/or spare columns in the interior of the cell array M in such a manner that there is at least one row or column of the cell array M disposed between two redundant rows or columns.

In the embodiment according to FIG. 2, which shows only a section of a cell array M, two spare rows RZ1 and RZ2 are provided at an edge of the cell array M. The spare row RZ1 is located outside the cell array M; the outer row Z1 and the outer column S1 again being marked by heavier lines. The second spare row RZ2 is located between the outer row Z1 of the cell array M and the row Z2 which follows the row Z1 inwardly. If applicable, a further spare row would have to be accomodated between the second and the third row of the cell array M.

If spare columns are also to be made available, or if only spare columns are to be made available, the same details then analogously apply to their disposition as discussed with reference to the rows.

The consequence of the above-described disposition of the spare elements (rows or columns) is that the addresses of the respective adjacent elements (rows or columns of the cell array M) next to the spare elements are known. The following procedure can be used for checking such memory modules:

Initially, the entire cell array is checked, using all addresses on the basis of the topography assumed as known (with the exception of the elements connected as replacements). In this way, all adjacency relationships between the elements which are not connected as replacements, are covered.

Then, all adjacent elements of spare elements are tested against all other addresses. In the process, all adjacency interferences with spare elements, having addresses which are not known, of course, and are as a rule different from module to module, are also detected. While the testing time per square element is then increased approximately by an amount equal to the time of the first test sweep, the testing program remains linear.

It should furthermore be pointed out that even in the construction according to FIG. 2, the spacings between the spare rows and the adjacent rows of the cell array, or between the spare columns and the adjacent columns of the cell array, can be made larger than the spacings otherwise provided in the cell array. It is therefore possible to limit the entire test of the module to the above-described first sweep, without great risk.

The foregoing is a description corresponding in substance to German application P No. 3221268.2, dated June 4, 1982, the International priority of which is being claimed for the instant application, and which is hereby made part of this application. Any material discrepancies between the foregoing specification and the aforementioned corresponding German application are to be resolved in favor of the latter.

I claim:

1. Integrated memory module, comprising at least one normally addressable cell array with edges and a matrix of memory cells disposed in rows, said rows being equally spaced apart by a given distance, and redundant memory cells disposed in rows at said edges of said normally addressable cell array for connection instead of defective rows of memory cells in said normally addressable cell array, each one of said rows of redundant memory cells being spaced apart from each other and from each one of said rows of memory cells of said normally addressable cell array by distances being greater than said given distance.

2. Integrated memory module according to claim 1, wherein said memory cells of said normally addressable cell array are also disposed in columns, said columns being equally spaced apart by a predetermined distance, said redundant memory cells are also disposed in columns at said edges of said normally addressable cell array, and each one of said columns of redundant memory cells are spaced apart from each other and from each one of said columns of memory cells of said normally addressable cell array by a distance being greater than said predetermined distance.

3. Integrated memory module, comprising at least one normally addressable cell array with edges and a matrix of memory cells disposed in columns, said columns being equally spaced apart by a given distance, and redundant memory cells disposed in columns at said edges of said normally addressable cell array for connection instead of defective columns of memory cells in said normally addressable cell array, each one of said columns of redundant memory cells being spaced apart from each other and from each one of said columns of memory cells of said normally addressable cell array by distances being greater than said given distance.

4. Integrated memory module, comprising at least one normally addressable cell array with edges and a matrix of memory cells disposed in rows, and redundant memory cells disposed in rows at said edges of said normally addressable cell array for connection instead of defective rows of memory cells in said normally addressable cell array, said rows of redundant memory cells including at most one row disposed outside said normally addressable cell array and at least one row disposed in said normally addressable cell array, at least one row of memory cells of said normally addressable cell array being disposed between each two adjacent rows of redundant memory cells.

5. Integrated memory module according to claim 4, wherein said rows of memory cells of said normally addressable cell array include rows adjacent said rows of redundant memory cells and other rows, and each one of said rows of redundant memory cells are spaced apart from said rows of memory cells of said normally addressable cell array adjacent thereto by a distance being greater than the distance between said other rows of memory cells of said normally addressable cell array.

6. Integrated memory module according to claim 4, wherein said memory cells of said normally addressable cell array are also disposed in columns, said redundant memory cells are also disposed in columns at said edges of said normally addressable cell array, and said columns of redundant memory cells include at most one column disposed outside said normally addressable cell array and at least one column disposed in said normally addressable cell array, at least one column of memory cells of said normally addressable cell array being disposed between each two adjacent columns of redundant memory cells.

7. Integrated memory module according to claim 6, wherein said rows of memory cells of said normally addressable cell array include rows adjacent said rows of redundant memory cells and other rows, and each one of said rows of redundant memory cells are spaced apart from said rows of memory cells of said normally addressable cell array adjacent thereto by a distance being greater than the distance between said other rows of memory cells of said normally addressable cell array.

8. Integrated memory module according to claim 6, wherein said columns of memory cells of said normally addressable cell array include columns adjacent said columns of redundant memory cells and other columns, and each one of said columns of redundant memory cells are spaced apart from said columns of memory cells of said normally addressable cell array adjacent thereto by a distance being greater than the distance between said other columns of memory cells of said normally addressable cell array.

9. Integrated memory module, comprising at least one normally addressable cell array with edges and a matrix of memory cells disposed in columns, and redundant memory cells disposed in columns at said edges of said normally addressable cell array for connection instead of defective columns of memory cells in said normally addressable cell array, said columns of redundant memory cells including at most one column disposed outside said normally addressable cell array and at least one column disposed in said normally addressable cell array, at least one column of memory cells of said normally addressable cell array being disposed between each two adjacent columns of redundant memory cells.

10. Integrated memory module according to claim 9, wherein said columns of memory cells of said normally addressable cell array include columns adjacent said columns of redundant memory cells and other columns, and each one of said columns of redundant memory cells are spaced apart from said columns of memory cells of said normally addressable cell array adjacent thereto by a distance being greater than the distance between said other columns of memory cells of said normally addressable cell array.

* * * * *